(12) United States Patent
Tan et al.

(10) Patent No.: US 10,217,794 B2
(45) Date of Patent: Feb. 26, 2019

(54) INTEGRATED CIRCUITS WITH VERTICAL CAPACITORS AND METHODS FOR PRODUCING THE SAME

(71) Applicant: Globalfoundries Singapore Pte. Ltd., Singapore (SG)

(72) Inventors: Juan Boon Tan, Singapore (SG); Mahesh Bhatkar, Singapore (SG); Bhushan Bharat, Singapore (SG); Wanbing Yi, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/992,811

(22) Filed: May 30, 2018

(65) Prior Publication Data

US 2018/0342556 A1 Nov. 29, 2018

Related U.S. Application Data

(63) Continuation-in-part of application No. 15/604,117, filed on May 24, 2017.

(51) Int. Cl.

| | |
|---|---|
| *H01L 29/92* | (2006.01) |
| *H01L 27/22* | (2006.01) |
| *H01L 43/02* | (2006.01) |
| *H01L 23/522* | (2006.01) |
| *H01L 49/02* | (2006.01) |
| *H01L 43/12* | (2006.01) |
| *H01L 43/08* | (2006.01) |

(52) U.S. Cl.
CPC ........ *H01L 27/222* (2013.01); *H01L 23/5223* (2013.01); *H01L 28/60* (2013.01); *H01L 43/02* (2013.01); *H01L 28/91* (2013.01); *H01L 43/08* (2013.01); *H01L 43/12* (2013.01)

(58) Field of Classification Search
CPC ..................... H01L 28/00; H01L 28/40–28/92
USPC .................................. 257/532, 534; 438/393
See application file for complete search history.

(56) References Cited

U.S. PATENT DOCUMENTS

| | | |
|---|---|---|
| 4,218,753 A | 8/1980 | Hendrie |
| 5,103,275 A | 4/1992 | Miura et al. |
| 5,350,705 A | 9/1994 | Brassington et al. |
| 5,663,905 A | 9/1997 | Matsuo et al. |
| 6,075,264 A | 6/2000 | Koo |
| 6,094,370 A | 7/2000 | Takashima |
| 6,314,017 B1 | 11/2001 | Emori et al. |
| 6,320,782 B1 | 11/2001 | Takashima |
| 6,423,584 B2 * | 7/2002 | Takahashi ................ G11C 7/18 |
| | | 257/E21.682 |
| 6,521,955 B1 | 2/2003 | Ida et al. |
| 6,627,931 B1 | 9/2003 | Casagrande et al. |
| 6,700,152 B2 | 3/2004 | Fukuda et al. |
| 6,897,502 B2 | 5/2005 | Watanabe et al. |
| 6,930,906 B2 | 8/2005 | Matsushita et al. |

(Continued)

*Primary Examiner* — Victoria K Hall
(74) *Attorney, Agent, or Firm* — Lorenz & Kopf, LLP

(57) ABSTRACT

Integrated circuits and methods of producing the same are provided. In an exemplary embodiment, an integrated circuit includes a capacitor, where the capacitor includes a first capacitor plate and a second capacitor plate. The first capacitor plate includes a first memory cell, and the second capacitor plate includes a second memory cell. The capacitor is utilized as a functional capacitor in the integrated circuit.

19 Claims, 7 Drawing Sheets

(56) References Cited

U.S. PATENT DOCUMENTS

| | | | |
|---|---|---|---|
| 7,698,678 B2 * | 4/2010 | Voldman | G06F 17/5063 361/735 |
| 9,305,977 B1 | 4/2016 | Hsu | |
| 9,368,206 B1 | 6/2016 | Dinh et al. | |
| 9,825,042 B2 | 11/2017 | Takemura | |
| 2001/0026467 A1 | 10/2001 | Noro et al. | |
| 2001/0048624 A1 | 12/2001 | Morimoto | |
| 2002/0036918 A1 | 3/2002 | Hidaka | |
| 2002/0075736 A1 | 6/2002 | Kumura et al. | |
| 2002/0131291 A1 | 9/2002 | Kurjanowicz et al. | |
| 2002/0141223 A1 | 10/2002 | Kang | |
| 2002/0141226 A1 | 10/2002 | Kato et al. | |
| 2002/0173111 A1 | 11/2002 | Kasai | |
| 2003/0043618 A1 | 3/2003 | Nakura et al. | |
| 2003/0223263 A1 | 12/2003 | Jacob et al. | |
| 2004/0021222 A1 | 2/2004 | Mori | |
| 2004/0056287 A1 | 3/2004 | Wohlfahrt | |
| 2004/0100835 A1 | 5/2004 | Sugibayashi et al. | |
| 2004/0232497 A1 | 11/2004 | Akiyama et al. | |
| 2004/0238881 A1 | 12/2004 | Ozawa | |
| 2005/0012125 A1 | 1/2005 | Summerfelt et al. | |
| 2005/0063214 A1 | 3/2005 | Takashima | |
| 2005/0212019 A1 | 9/2005 | Kamoshida et al. | |
| 2005/0280061 A1 | 12/2005 | Lee | |
| 2007/0121392 A1 | 5/2007 | Nawaki | |
| 2007/0171728 A1 | 7/2007 | Cho | |
| 2007/0173020 A1 | 7/2007 | Ozawa et al. | |
| 2007/0177431 A1 | 8/2007 | Matsunaga et al. | |
| 2007/0180219 A1 | 8/2007 | Lino et al. | |
| 2007/0183208 A1 | 8/2007 | Tanaka et al. | |
| 2007/0297210 A1 | 12/2007 | Ueda | |
| 2009/0231902 A1 | 9/2009 | Takashima | |
| 2011/0143506 A1 * | 6/2011 | Lee | H01L 23/481 438/238 |
| 2012/0075917 A1 | 3/2012 | Takemura | |
| 2013/0049093 A1 | 2/2013 | Lee et al. | |
| 2013/0119452 A1 | 5/2013 | Endoh et al. | |
| 2013/0208536 A1 | 8/2013 | Allenspach et al. | |
| 2013/0221314 A1 | 8/2013 | Pramanik et al. | |
| 2014/0021584 A1 * | 1/2014 | Tu | H01L 27/10897 257/532 |
| 2014/0098595 A1 | 4/2014 | Kawashima et al. | |
| 2014/0104925 A1 | 4/2014 | Azuma et al. | |
| 2015/0102459 A1 | 4/2015 | Lai et al. | |
| 2015/0372056 A1 | 12/2015 | Seong et al. | |
| 2016/0148990 A1 | 5/2016 | Tu et al. | |
| 2016/0293615 A1 | 10/2016 | Kwon | |
| 2016/0293618 A1 | 10/2016 | Namkoong et al. | |
| 2017/0092649 A1 | 3/2017 | Takaoka | |
| 2017/0092693 A1 | 3/2017 | Tan et al. | |
| 2017/0179131 A1 | 6/2017 | Lin et al. | |
| 2017/0213595 A1 | 7/2017 | Park | |
| 2017/0237000 A1 | 8/2017 | Terai et al. | |
| 2017/0243919 A1 | 8/2017 | Seong et al. | |

* cited by examiner

INTEGRATED CIRCUITS WITH VERTICAL CAPACITORS AND METHODS FOR PRODUCING THE SAME

This application is a continuation-in-part of prior U.S. application Ser. No. 15/604,117, filed May 24, 2017.

TECHNICAL FIELD

The technical field generally relates to integrated circuits with vertical capacitors and methods of producing the same, and more particularly relates to integrated circuits with vertical capacitors having increased capacitance and methods of producing the same.

BACKGROUND

Integrated circuits are becoming smaller and smaller as time goes by, so many components must fit within limited space. One technique used to reduce the footprint of a capacitor is to form the capacitor plates vertically, relative to a substrate, so the capacitor plates occupy a smaller footprint on the substrate. The overall integrated circuit manufacturing process includes many steps that are performed in a predetermined sequence. Adding new steps into the process increases cost and complexity. The vertical space available without modifications or additions to an existing design and manufacturing process is limited to the existing design dimensions. Higher capacitance is desirable for many capacitors, such as capacitors in electrostatic discharge protection circuits, but increasing the vertical distance within the integrated circuit for taller capacitor plates increases costs. Larger capacitor plates increase the capacitance, but the desire to produce smaller integrated circuits, and the desire to limit the manufacturing process to existing process steps, limits the size of the vertical capacitor plates.

Accordingly, it is desirable to provide integrated circuits with vertical capacitors having increased capacitance compared to traditional vertical capacitors. In addition, it is desirable to provide integrated circuits with vertical capacitors using manufacturing processes that are already within the process flow for producing an integrated circuit, and methods of producing the same. Furthermore, other desirable features and characteristics of the present embodiment will become apparent from the subsequent detailed description and the appended claims, taken in conjunction with the accompanying drawings and this background.

BRIEF SUMMARY

Integrated circuits and methods of producing the same are provided. In an exemplary embodiment, an integrated circuit includes a capacitor with a first capacitor plate and a second capacitor plate. The first capacitor plate includes a first memory cell, and the second capacitor plate includes a second memory cell. The capacitor is utilized as a functional capacitor in the integrated circuit.

An integrated circuit is provided in another embodiment. The integrated circuit includes a first vertical contact stack with a first base contact and a first stacked contact that overlies the first base contact. The first stacked contact and the first base contact are in direct electrical contact. The integrated circuit also includes a second vertical contact stack with a second base contact and a second stacked contact overlying the second base contact. The second stacked contact and the second base contact are in direct electrical contact. A base interlayer dielectric is positioned between the first and second base contacts, and a stacked interlayer dielectric is positioned between the first and second stacked contacts. A first memory cell is in direct electrical contact with the first vertical contact stack, and a second memory cell is in direct electrical contact with the second vertical contact stack. An MTJ dielectric layer is positioned between the first and second memory cells.

A method of producing an integrated circuit is provided in yet another embodiment. The method includes forming a first and second base contact within a base interlayer dielectric that is positioned between the first and second base contacts. A stacked interlayer dielectric is formed overlying the base interlayer dielectric, and first and second stacked contacts are formed within the stacked interlayer dielectric overlying the first and second base contacts, respectively. The stacked interlayer dielectric is positioned between the first and second stacked contacts. The first base and stacked contacts are in electrical communication, and the second base and stacked contacts are in electrical communication. A first memory cell is formed overlying the first stacked contact, where the first memory cell is in electrical communication with the first stacked contact. A first capacitor interconnect is formed in electrical communication with the first memory cell such that a first capacitor plate includes the first base and stacked contacts and the first memory cell. A second capacitor interconnect is formed in electrical communication with the second stacked contact such that a second capacitor plate includes the second base and stacked contacts. A capacitor includes the first and second capacitor plates, and the capacitor is utilized as a functional capacitor in the integrate circuit.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. The various tasks and process steps described herein may be incorporated into a more comprehensive procedure or process having additional steps or functionality not described in detail herein. In particular, various steps in the manufacture of integrated circuits are well-known and so, in the interest of brevity, many conventional steps will only be mentioned briefly herein or will be omitted entirely without providing the well-known process details. In brief, the size of vertical capacitor plates is increased by including memory cells within the vertical capacitor plates, where the memory cells serve as part of the capacitor plates.

Figure 1:
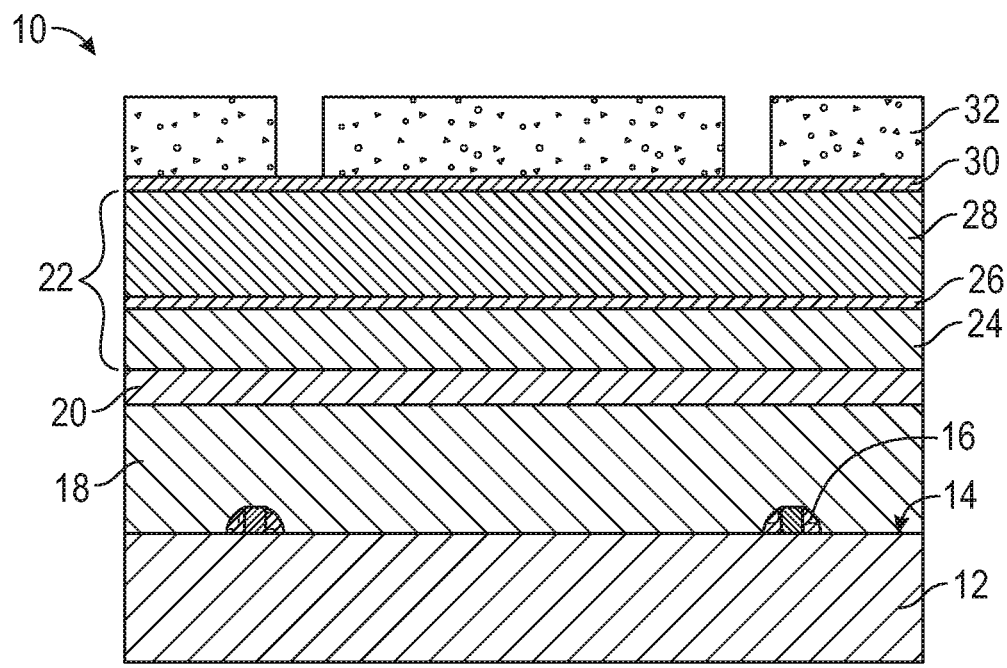
FIGS. 1-4, 7-10, 12, and 13 illustrate, in cross sectional views, an integrated circuit and methods for producing the same in accordance with exemplary embodiments.

Referring to an exemplary embodiment illustrated in FIG. 1, an integrated circuit 10 includes a substrate 12 formed of a semiconductor material. As used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. As referred to herein, a material that includes a recited element/compound includes the recited element/compound in an amount of at least about 1 weight percent or more based on the total weight of the material unless otherwise indicated. In many embodiments, the substrate 12 primarily includes a monocrystalline semiconductor material. As used herein, a substance "primarily" includes an element or compound if the element or compound is more than 50 weight percent of the total mass of the substance. The substrate 12 may be a bulk silicon wafer (as illustrated) or may be a thin layer of silicon on an insulating layer (commonly known as silicon-on-insulator or SOI, not illustrated) that, in turn, is supported by a carrier wafer. The substrate 12 has a substrate surface 14, and the substrate surface 14 may be used as a reference for various components described herein. A "horizontal" direction for the integrated circuit 10 generally refers to a plane that is parallel to the substrate surface 14, and a "vertical" direction is perpendicular to the substrate surface 14.

An electronic component 16 is formed on and/or in the substrate 12 in various embodiments, and a component interlayer dielectric 18 overlies the substrate 12. As used herein, the term "overlying" means "over" such that an intervening layer may lie between the component interlayer dielectric 18 and the substrate 12, or "on" such that the component interlayer dielectric 18 physically contacts the substrate 12. The electronic component 16 includes one or more of a wide variety of components, such as transistors, resistors, diodes, capacitors, etc., where the electronic component 16 is generally utilized for operation of the integrated circuit 10. The component interlayer dielectric 18 is an electrically insulating material, such as silicon dioxide, but the component interlayer dielectric 18 includes other electrically insulating materials in alternate embodiments. As used herein, an "electrically insulating material" is a material with a resistivity of about $1 \times 10^4$ ohm meters or more, an "electrically conductive material" is a material with a resistivity of about $1 \times 10^{-4}$ ohm meters or less, and an "electrically semiconductive material" is a material with a resistivity of from about more than $1 \times 10^{-4}$ ohm meters to less than about $1 \times 10^4$ ohm meters.

A component etch stop layer 20 overlies the component interlayer dielectric 18 in an exemplary embodiment, but the component etch stop layer 20 is not present in alternate embodiments. The component etch stop layer 20 is an electrical insulator, such as silicon nitride in an exemplary embodiment, but the component etch stop layer 20 includes other materials in alternate embodiments. A base interlayer dielectric 22 overlies the component etch stop layer 20, where the base interlayer dielectric 22 is an electrical insulator. In an exemplary embodiment, the base interlayer dielectric includes a base bottom dielectric 24, a base bottom etch stop 26 overlying the base bottom dielectric 24, a base top dielectric 28 overlying the base bottom etch stop 26, and a base top etch stop 30 overlying the base top dielectric 28. In an exemplary embodiment, the base bottom and top dielectric 24, 28 include silicone dioxide, but other electrically insulating materials are used in alternate embodiments, such as low K dielectric materials. The base bottom and top etch stop 26, 30 include silicon nitride in an exemplary embodiment, but other materials are used in alternate embodiment. In alternate embodiments, the base interlayer dielectric 22 includes fewer layers, such as a total of one layer.

A first base photoresist layer 32 is formed and patterned overlying the base interlayer dielectric 22 in an exemplary embodiment. The first base photoresist layer 32 (and other photoresist layers described below) may be deposited by spin coating, and patterned by exposure to light or other electromagnetic radiation through a mask with transparent sections and opaque sections. The light causes a chemical change in the photoresist such that either the exposed portion or the non-exposed portion can be selectively removed. The desired locations may be removed with an organic solvent, and the first base photoresist layer 32 remains overlying the other areas of the base interlayer dielectric 22. The first base photoresist layer 32 (and other photoresist layers described below) may optionally include a top and/or bottom anti-reflective coating and/or a hard mask (not illustrated). Many anti-reflective coatings are available, including inorganic and organic compounds, such as titanium nitride or organosiloxanes. Titanium nitride may be deposited by chemical vapor deposition using tetramethylamidotitanium and nitrogen trifluoride, and organosiloxanes may be deposited by spin coating. Anti-reflective coatings may improve the accuracy and critical dimensions during photoresist patterning. Silicon nitride may be used as a hard mask, where silicon nitride can be formed by low pressure chemical vapor deposition using ammonia and dichlorosilane.

Figure 2:
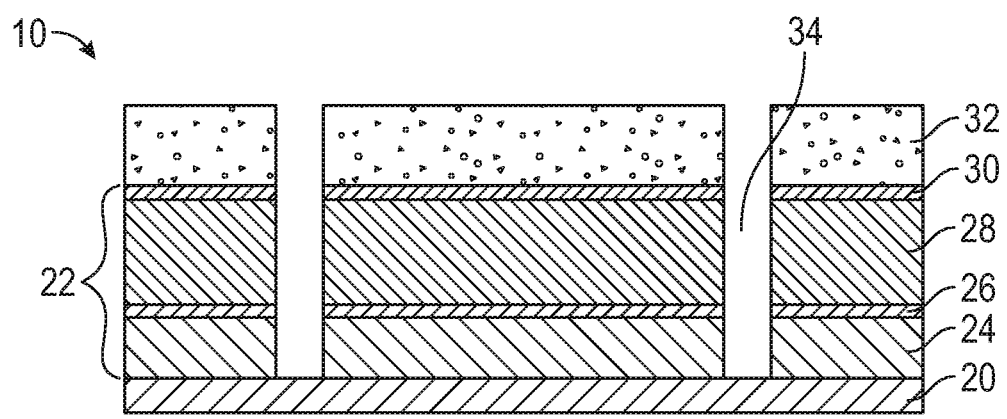

Reference is made to an exemplary embodiment in FIG. 2, where the component dielectric and underlying areas are not illustrated to simplify the figures. A via 34 is anisotropically etched through the base interlayer dielectric 22. In an exemplary embodiment, the base bottom and top etch stops 26, 30 are plasma etched using hydrogen and nitrogen trifluoride, and the base bottom and top dielectrics 24, 28 are reactive ion etched using carbon tetrafluoride, but other etch techniques or materials are used in alternate embodiments. The via 34 extends through the base interlayer dielectric 22 to the component etch stop layer 20 in the illustrated embodiment. The first base photoresist layer 32 and other photoresist layers are removed after use, such as with an oxygen containing plasma.

Figure 3:
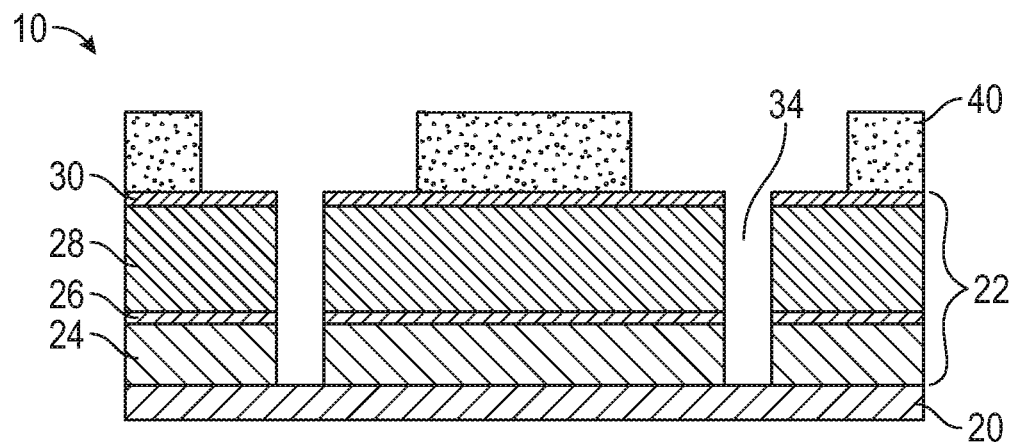

A second base photoresist layer 40 is formed and patterned overlying the base interlayer dielectric 22, as illustrated in an embodiment in FIG. 3. The second base photoresist layer 40 is patterned to remove photoresist material from over the via 34 and from an area around the via 34. A trench 42 is then etched to the base bottom etch stop 26, where the trench 42 encompasses the upper portions of the via 34, as illustrated in an embodiment in FIG. 4. This produces a two step trench or via including a narrow bottom portion (the via 34) and a wider top portion (the trench 42).

Figure 4:
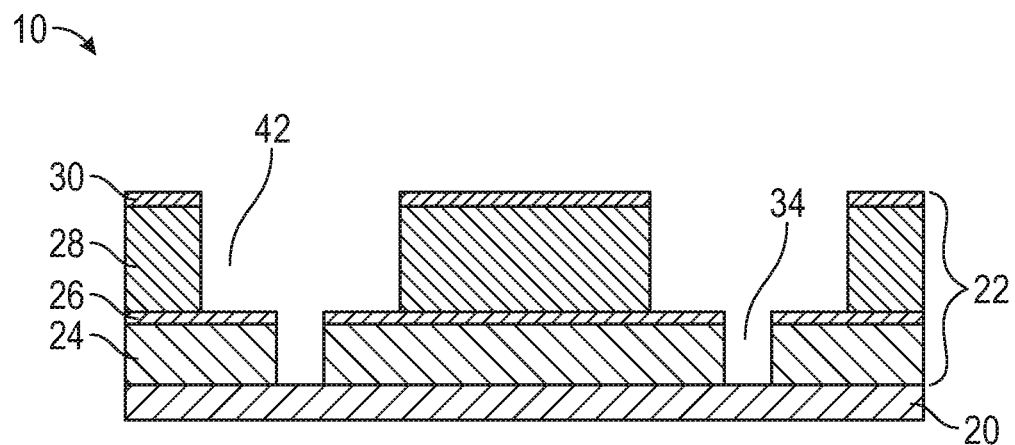
Figure 5:
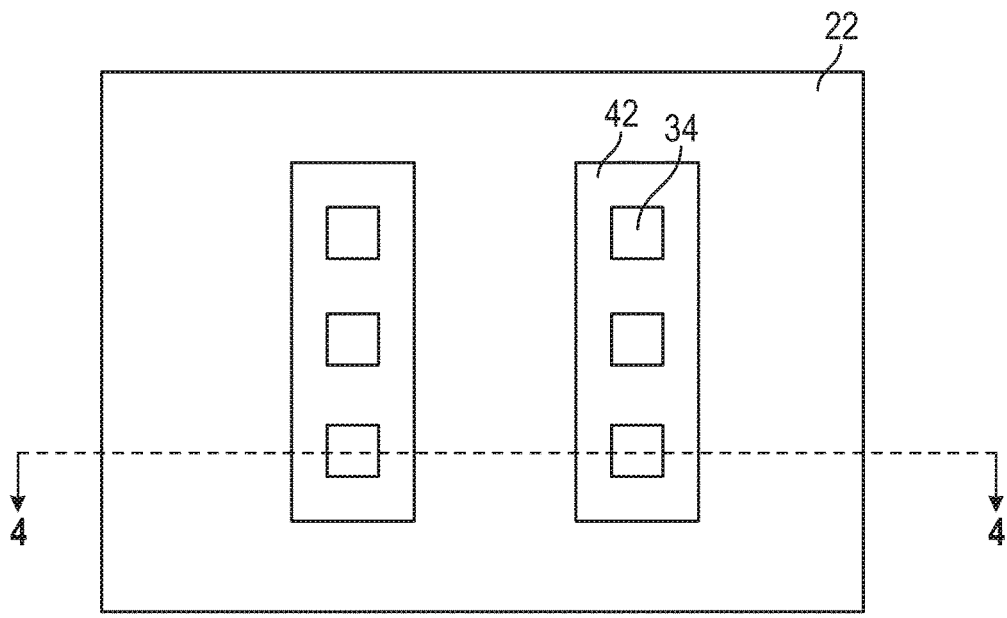
FIGS. 5, 6, and 14 illustrate, in plan views, an integrated circuit and methods for producing the same in accordance with exemplary embodiments.
Figure 6:
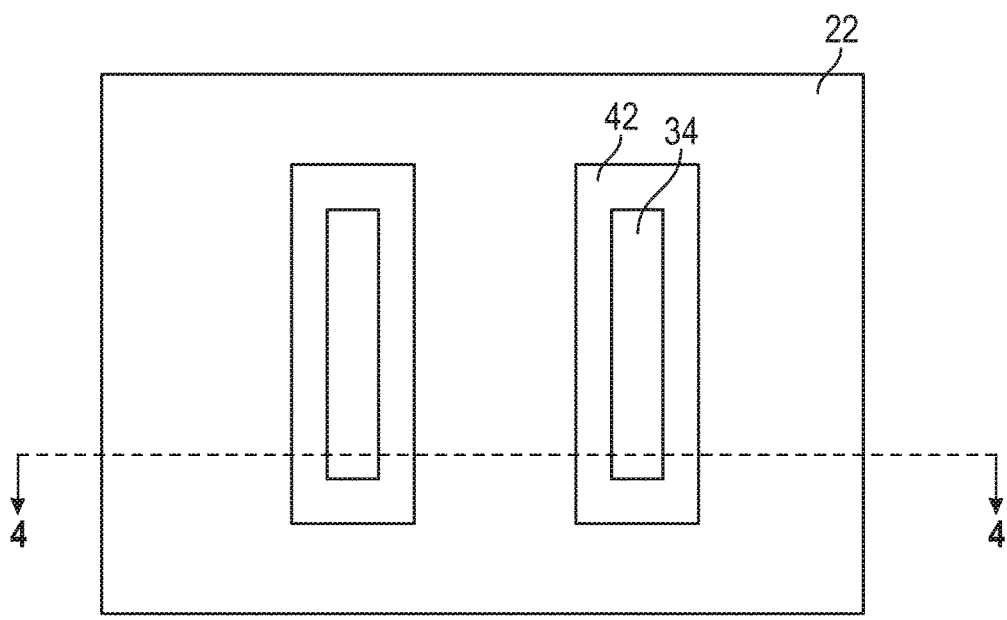

FIGS. 5 and 6 illustrate top views of different embodiments of the trench 42 and via 34 within the base interlayer dielectric 22, with continuing reference to FIG. 4. The top views illustrate a horizontal view of the integrated circuit 10, and the side view of FIG. 4 illustrates a vertical view. FIG. 4 is taken along line 4-4 in FIGS. 5 and 6. In the embodiment in FIG. 5, three vias 34 are formed within a trench 42, where one continuous trench 42 includes all three vias 34. The trench 42 includes more or fewer vias 34 in alternate embodiments. In the embodiment illustrated in FIG. 6, one single long via 34 is formed within one single long trench 42. The single long via 34 in FIG. 6 has more surface area in the horizontal direction than the three separate vias 34 in FIG. 5, while the trench 42 in FIG. 5 and the trench 42 in FIG. 6 have about the same surface area in the horizontal direction.

Figure 7:
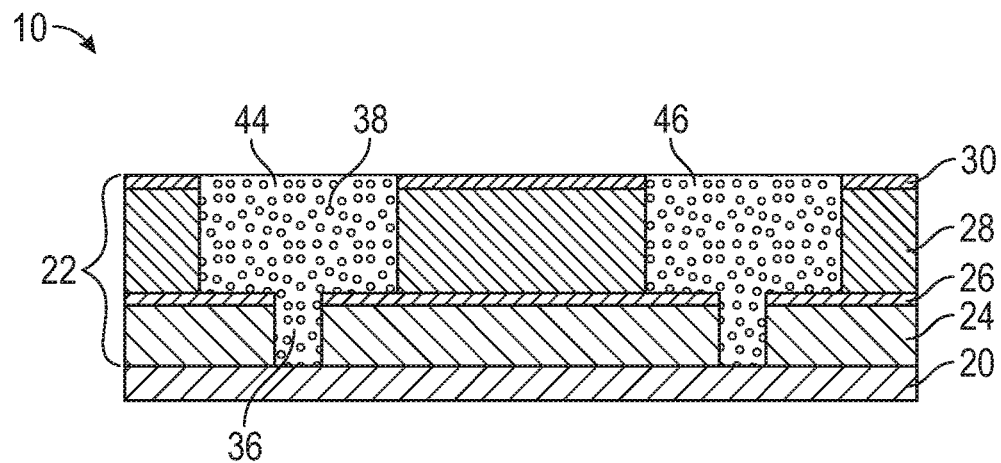

FIG. 7 illustrates an embodiment where a first base contact 44 and a second base contact 46 are formed in adjacent vias 34 and trenches 42, with further reference to FIG. 4. The first and second base contacts 44, 46 are adjacent to each other. The first and second base contacts 44, 46 are electrical conductors. In an exemplary embodiment, the first and second base contact 44, 46 include a seed layer (not individually illustrated) and a core (not individually illustrated). The seed layer may improve adhesion of the core to dielectric materials of the base interlayer dielectric 22, and thereby improve reliability. In one embodiment, the seed layers are formed of copper and manganese deposited by physical vapor deposition using copper amidinate and manganese amidinate. The core is then deposited by copper electroplating followed by chemical mechanical planarization to remove the overburden. The first and second base contact 44, 46 include copper in an exemplary embodiment, but other metals or conductive materials are used in alternate embodiments. The first and second base contacts 44, 46 include a lower column 36 formed in the via 34 and an upper column 38 formed in the trench 42, where the lower column 36 has a smaller cross sectional area than the upper column 38.

Figure 8:
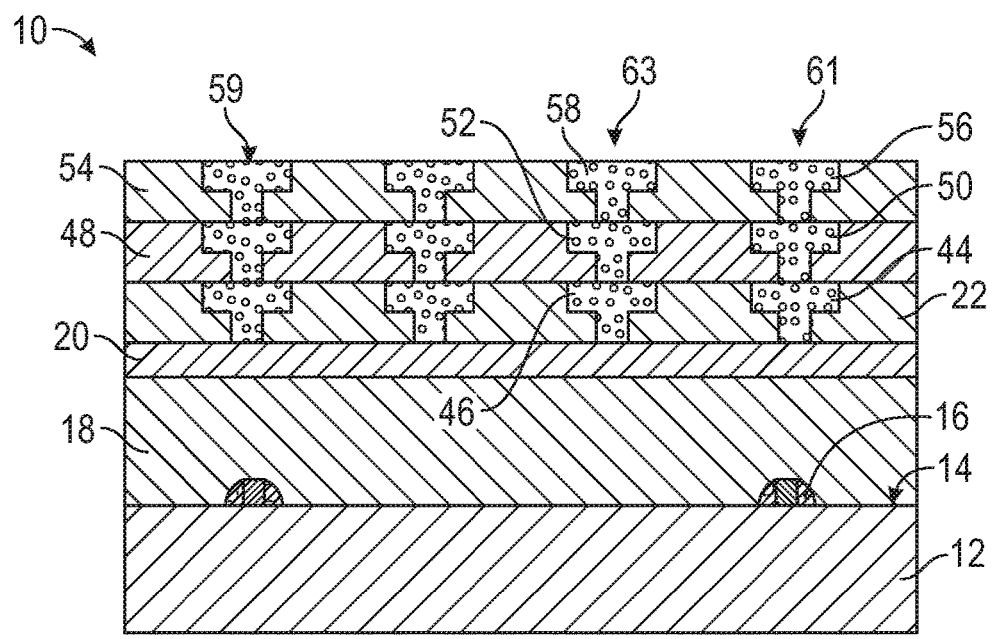

Reference is made to the embodiment in FIG. 8. A stacked interlayer dielectric 48 is formed overlying the base interlayer dielectric 22 and the first and second base contacts 44, 46. The stacked interlayer dielectric 48 is an electrical insulator, and includes silicon dioxide in an exemplary embodiment. Silicon dioxide may be deposited by chemical vapor deposition using silane and oxygen. However, other electrically insulating materials are used in alternate embodiments. The stacked interlayer dielectric 48 may optionally include etch stop layers and other components, as described above for the base interlayer dielectric 22, where the etch stop layers and intervening dielectrics are not individually illustrated in FIG. 8. The techniques described above to form the first and second base contacts 44, 46 are repeated to form a first stacked contact 50 and a second stacked contact 52, where the first stacked contact 50 directly overlies the first base contact 44 and the second stacked contact 52 directly overlies the second base contact 46. The first base contact 44 and the first stacked contact 50 are in electrical communication, and in some embodiments are in direct electrical contact. The term "electrical communication," as used herein, means electrical current is capable of flowing from one component to another, where the electrical current may or may not flow through an electrically conductive or semiconductive intervening component. The term "direct electrical contact," as used herein, means direct physical contact between components that are electrically conductive or semiconductive, but not electrically insulating. In a similar manner, the second base contact 46 and the second stacked contact 52 are in electrical communication, and in direct electrical contact in some embodiments. The first and second stacked contacts 50, 52 are electrical conductors.

In a similar matter, a tertiary interlayer dielectric 54 is formed overlying the stacked interlayer dielectric 48. A first tertiary contact 56 is formed overlying the first stacked contact 50, and in electrical communication and in some embodiments in direct electrical contact with the first stacked contact 50. A second tertiary contact 58 is formed overlying the second stacked contact 52, and in electrical communication and in some embodiments in direct electrical contact with the second stacked contact 52. The first and second base, stacked and tertiary contacts 44, 46, 50, 52, 56, 58 form a pair of vertical contact stacks 59 in the vertical direction (i.e., perpendicular to the substrate surface 14). The vertical contact stacks 59 may include two, three, four, or more contacts stacked vertically in various embodiments, where each contact in the vertical contact stack 59 directly contacts the adjacent contact(s) such that the entire vertical contact stack 59 is continuous. Reference herein to the vertical contact stack 59 being "continuous" means each contact within the vertical contact stack 59 directly touches the adjacent contact(s) such that the bottom and top contacts are in electrical communication through an unbroken chain of contacts. The vertical contact stacks 59 include a first vertical contact stack 61 and a second vertical contact stack 63, wherein the first vertical contact stack 61 includes at least two of the first base, stacked, and tertiary contacts 44, 50, 56, and the second vertical contact stack 63 includes at least two of the second base, stacked, and tertiary contacts 46, 52, 58. The base interlayer dielectric 22 is positioned between the first and second base contacts 44, 46, as well as around the first and second base contacts 44, 46. In the same manner, the stacked interlayer dielectric 48 is positioned between the first and second stacked contacts 50, 52, and the tertiary interlayer dielectric 54 is positioned between the first and second tertiary contacts 56, 58, all of which overlie the substrate 12.

Figure 9:
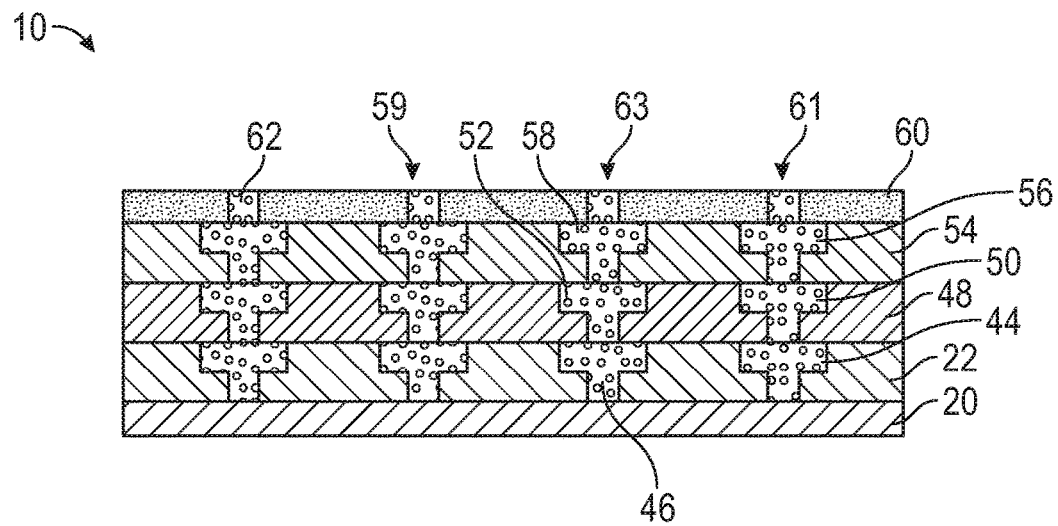

Referring to an embodiment illustrated in FIG. 9, a passivation layer 60 is formed and patterned overlying the tertiary interlayer dielectric 54 and the associated first and second tertiary contacts 56, 58. The passivation layer 60 is patterned with lithography using an appropriate etchant. The passivation layer 60 is an electrical insulator, and many electrical insulator options are possible. For example, nonorganic materials such as un-doped silicate glass (USG), silicon nitride, silicon oxynitride, silicon dioxide, or combinations thereof may be used. In alternative embodiments, the passivation layer 60 includes a polymer, such as an epoxy, polyimide, benzocyclobutene (BCB), polybenzoxazole (PBO), or the like, although other compounds may also be used. The passivation layer 60 is lithographically patterned to expose a top surface of the topmost contact in the vertical contact stacks 59, such as the first and second tertiary contacts 56, 58 in the illustrated embodiment. The passivation layer 60 also covers the topmost interlayer dielectric, such as the tertiary interlayer dielectric 54 in the illustrated embodiment. A lower MTJ contact 62 is formed in the opening of the passivation layer 60, where the lower MTJ contact 62 is an electrical conductor. The MTJ contact 62 is copper that is formed by a single damascene process in an exemplary embodiment, but other electrically conductive materials are utilized in alternate embodiments.

Figure 10:
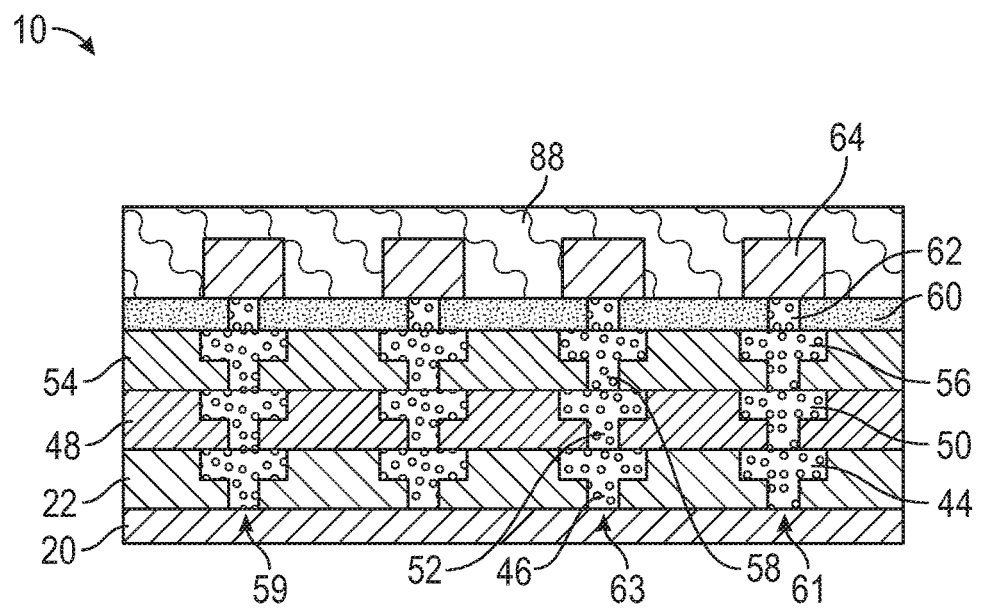

FIG. 10 illustrates an embodiment where several layers are formed overlying the passivation layer 60. The layers are then lithographically patterned and etched to produce one or more magnetic tunnel junction (MTJ) memory cells 64, where the structure of the MTJ memory cells 64 may be the same as that of other magnetic tunnel junction memory cells, such as those produced in a memory bank area of the integrated circuit 10. An MTJ dielectric layer 88 is then formed around and over the memory cells 64, where the MTJ dielectric layer 88 is an electrical insulator. The MTJ dielectric layer 88 is silicon dioxide in an exemplary embodiment, which may be formed by chemical vapor deposition using silane and oxygen, but other electrically insulating materials are utilized in alternate embodiments.

Figure 11:
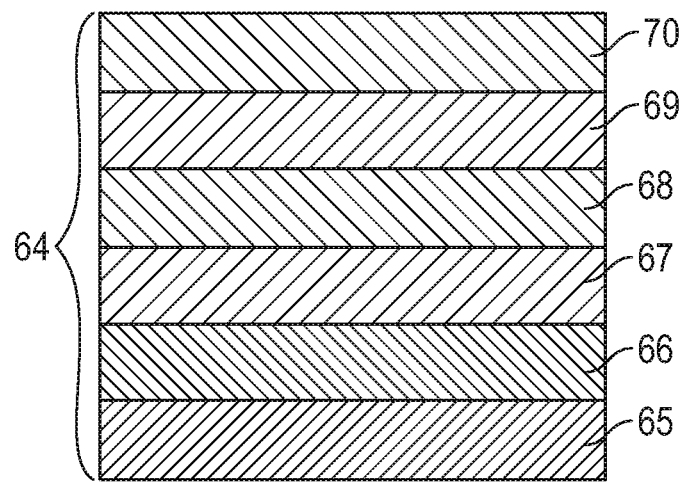
FIG. 11 illustrates, in a cross sectional view, a portion of an exemplary embodiment of a memory cell.

The memory cells 64 may include various layers formed of different combinations of materials, which are individually illustrated in FIG. 11 with continuing reference to FIG. 10. In an exemplary embodiment, the memory cells 64 includes a bottom electrode 65, a pinning layer 66 overlying the bottom electrode 65, a fixed magnetic layer 67 overlying the pinning layer 66, a tunnel barrier layer 68 overlying the fixed magnetic layer 67, a free layer 69 overlying the tunnel barrier layer 68, and a top electrode 70 overlying the free layer 69. In addition, the memory cells 64 may have other variations including other layers, such as anti-ferro-magnetic layers. The top and bottom electrodes 70, 65 are electrically conductive materials, such as copper, titanium, or other electrically conductive materials. The pinning layer 66, the fixed magnetic layer 67, and the free layer 69 include magnetic materials and are magnetic, and the tunnel barrier layer 68 is an electrical insulator that is non-magnetic. As used herein, a layer or material is "magnetic" if it is a ferromagnetic material, where the term "ferromagnetic" does not require the presence of iron. More particularly, a material is "magnetic" if it is a permanent magnet that retains its magnetic field after an induction magnetic field is removed, where the permanent magnet has a residual flux density of about 0.1 tesla or more. A layer or material is "non-magnetic" if it is a diamagnetic or a paramagnetic material, and more particularly does not form a permanent magnet or is only capable of forming a permanent magnet that has a residual flux density of less than about 0.1 tesla or less. A "permanent" magnet is a magnet that has residual flux density of about 0.1 tesla or more for at least about 1 week or more after being removed from an induction magnetic field.

In some embodiments, one or more of the pinning layer 66, the fixed magnetic layer 67, the tunnel barrier layer 68, and/or the free layer 69 include a plurality of layers (not individually illustrated). The top and bottom electrodes 70, 65 may also include more than one layer in some embodiments. In an exemplary embodiment, the pinning layer 66 is formed of cobalt iron (CoFe), platinum manganese (PtMn), or other materials, the tunnel barrier layer 68 is primarily formed of magnesium oxide (MgO), and the fixed magnetic layer 67 and the free layer 69 are formed primarily of cobalt iron boron (CoFeB), but other materials are used in alternate embodiments. The magnetic moment of the free layer 69 may be programmed causing the resistance of the resulting memory cells 64 to change between a high resistance and a low resistance. In an exemplary embodiment, the free layer 69 is programmed to have a magnetic pole that is parallel relative to the magnetic pole of the fixed magnetic layer 67, which provides a low resistance, where the low resistance is lower than the high resistance when the free layer 69 and the fixed magnetic layer 67 have anti-parallel magnetic poles.

Figure 12:
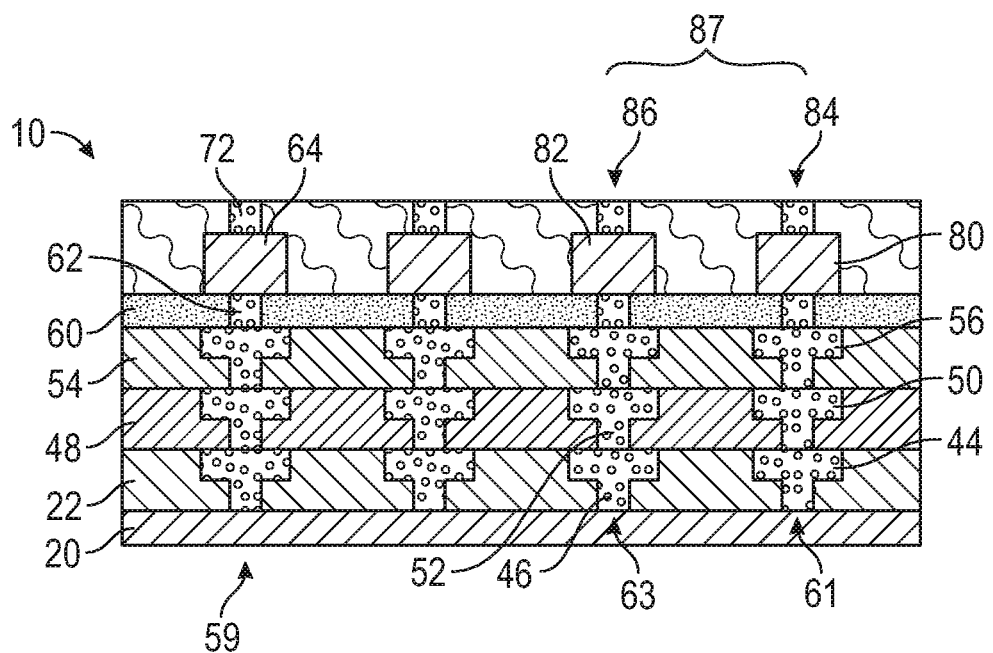

Referring to an exemplary embodiment in FIG. 12, an upper MTJ contact 72 is formed in the MTJ dielectric layer 88. The upper MTJ contact 72 overlies the memory cells 64 and is electrical communication with the uppermost layer of the memory cell 64 (the top electrode 70 in the embodiment illustrated in FIG. 11.) The upper MTJ contact 72 is an electrical conductor. In an exemplary embodiment, the upper MTJ contact 72 includes copper and is formed by a single damascene process, but other conductive materials or production processes may also be used. The lower MTJ contact 62, the memory cell 64, and the upper MTJ contact 72 are all in electrical communication with the vertical contact stacks 59.

The memory cells 64 include a first memory cell 80 that is produced overlying and in electrical communication with the first base, stacked, and tertiary contacts 44, 50, 56, and a second memory cell 82 formed overlying and in electrical communication with the second base, stacked, and tertiary contacts 46, 52, 58. In some embodiments, the first and second memory cells 80, 82 are in direct electrical contact with the uppermost contact of first and second vertical contact stacks 61, 63, respectively. The first and second memory cells 80, 82 include a stack with remaining portions of the lower MTJ contact 62, the memory cell 64, and the upper MTJ contact 72. The first base, stacked and tertiary contacts 44, 50, 56 and the first memory cell 80 form a conductive vertical plate that is a first capacitor plate 84, and the second base, stacked, and tertiary contacts 46, 52, 58 combined with the second memory cell 82 form another conductive vertical plate that is a second capacitor plate 86. The first and second capacitor plates 84, 86 form a capacitor 87, where the first and second capacitor plates 84, 86 are separated by dielectric material. In an alternate embodiment, one of the first or second memory cells 80, 82 is replaced with a contact.

Figure 13:
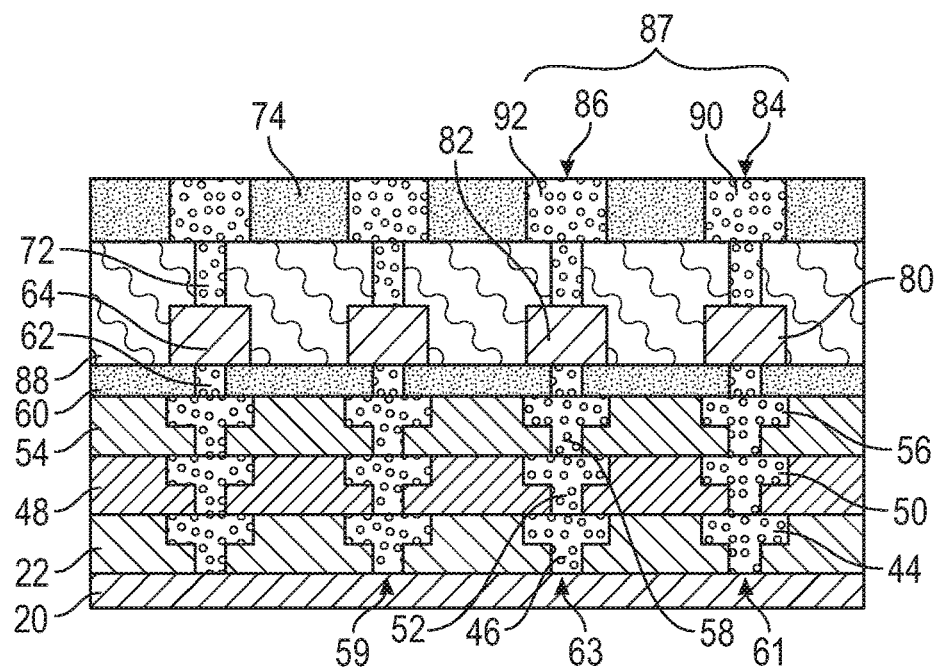
Figure 14:
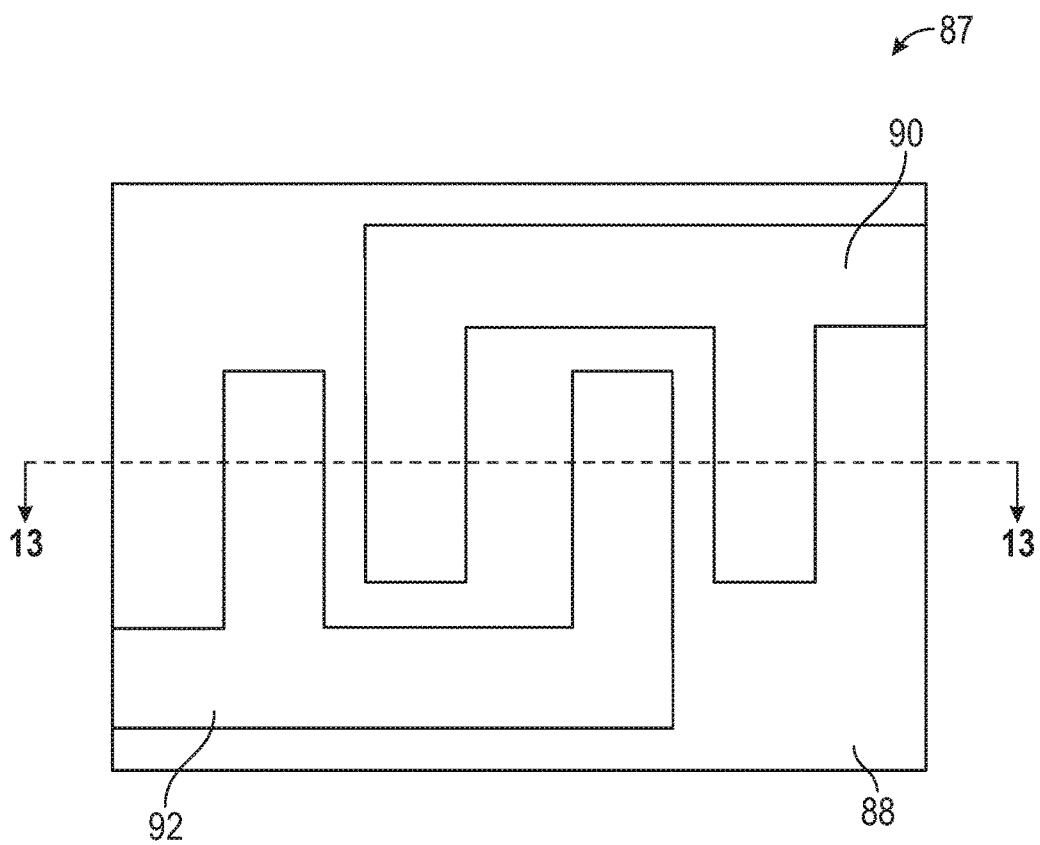

In an exemplary embodiment illustrated in FIG. 13, an interconnect dielectric 74 is formed overlying the vertical contact stacks 59 and the MTJ dielectric layer 88. A first capacitor interconnect 90 is formed in electrical communication with the first capacitor plate 84, and a second capacitor interconnect 92 is formed in electrical communication with the second capacitor plate 86, where the first and second capacitor interconnects 90, 92 are formed in the interconnect dielectric 74. In an exemplary embodiment, the first and second capacitor interconnects 90, 92 are formed in a similar manner to the contacts described above, but other techniques are used in alternate embodiments. The first and second capacitor interconnects 90, 92 are formed from an electrically conductive material, such as copper or other metals, and the first and second capacitor interconnects 90, 92 are electrically isolated from each other. The first and second capacitor plates 84, 86 are separated by dielectric material from the base, stacked, and tertiary interlayer dielectrics 22, 48, 54 combined with the passivation layer 60 and the MTJ dielectric layer 88. FIG. 14 illustrates a top view of the first and second capacitor interconnects 90, 92, where FIG. 13 is taken along line 13-13 in FIG. 14.

The first and second capacitor plates 84, 86 form the capacitor 87 that is incorporated into the integrated circuit 10 with the first and second capacitor interconnects 90, 92. The first and second memory cells 80, 82 form a portion of the first and second capacitor plates 84, 86, and thereby the first and second memory cells 80, 82 increase the effective size of the first and second capacitor plates 84, 86 compared to the same capacitor plates without the first and second memory cells 80, 82. The first and second capacitor plates 84, 86, including the first and second memory cells 80, 82, are utilized as a functional capacitor within the integrated circuit 10. In some embodiments, the first and second memory cells 80, 82 are utilized as a part of the capacitor 87, and are not utilized as memory cells for the storage of information as memory. Comparable memory cells in a memory bank may be produced in other portions of the integrated circuit 10 at the same time as the first and second memory cells 80, 82, so the production of the first and second memory cells 80, 82 is easily incorporated into a manufacturing process that forms other memory cells that are used for storing information as memory. As such, inclusion of the first and second memory cells 80, 82 in the first and second capacitor plates 84, 86 increases the effective size of the first and second capacitor plates 84, 86 with relatively minor changes to an existing manufacturing process. The increased size of the first and second capacitor plates 84, 86, compared to the same plates without the first and second memory cells 80, 82, increases the capacitance of the capacitor 87 formed from the first and second capacitor plates 84, 86. The embodiment described herein includes MTJ memory cells, but other types of memory cells could be used in alternate embodiments.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. An integrated circuit comprising:
a capacitor comprising a first capacitor plate and a second capacitor plate, wherein the first capacitor plate comprises a first memory cell, and wherein the second capacitor plate comprises a second memory cell, and wherein the capacitor is utilized within the integrated circuit as a functional capacitor.

2. The integrated circuit of claim 1 wherein the first memory cell comprises pinning layer that is magnetic, a tunnel barrier layer overlying the pinning layer, wherein the tunnel barrier layer comprises an electrically insulating material, and a free layer overlying the tunnel barrier layer, wherein the free layer is magnetic.

3. The integrated circuit of claim 2 wherein the tunnel barrier layer comprises magnesium oxide.

4. The integrated circuit of claim 2 wherein the pinning layer and the free layer are magnetic.

5. The integrated circuit of claim 2 wherein the pinning layer and the free layer have parallel magnetic poles.

6. The integrated circuit of claim 1 wherein the first capacitor plate further comprises:
a first base contact; and
a first stacked contact overlying the first base contact, wherein the first stacked contact underlies the first memory cell, and wherein the first base contact, the first stacked contact, and the first memory cell are all in electrical communication.

7. The integrated circuit of claim 1 further comprising one or more interlayer dielectric layers positioned between the first capacitor plate and the second capacitor plate.

8. The integrated circuit of claim 1 wherein:
the first capacitor plate comprises a first base contact and a first stacked contact overlying the first base contact, wherein the first stacked contact is in direct electrical contact with the first base contact.

9. The integrated circuit of claim 8 wherein:
the first capacitor plate further comprises a first tertiary contact overlying the first stacked contact, wherein the first tertiary contact is in direct electrical contact with the first stacked contact.

10. The integrated circuit of claim 8 wherein:
the first capacitor plate comprises a first vertical contact stack, wherein the first vertical contact stack comprises the first base contact and the first stacked contact, and wherein the first memory cell is in direct electrical contact with the first vertical contact stack.

11. The integrated circuit of claim 1 wherein:
the first capacitor plate comprises a first vertical contact stack, wherein the first vertical contact stack comprises a first base contact and a first stacked contact overlying the first base contact, wherein the first stacked contact is in direct electrical contact with the first base contact, wherein the first memory cell is in direct electrical contact with the first vertical contact stack; and
the second capacitor plate comprises a second vertical contact stack, wherein the second vertical contact stack comprises a second base contact and a second stacked contact overlying the second base contact, wherein the second stacked contact is in direct electrical contact with the second base contact, wherein the second memory cell is in direct electrical contact with the second vertical contact stack; the integrated circuit further comprising:
a base dielectric layer between the first base contact and the second base contact;
a stacked dielectric layer between the first stacked contact and the second stacked contact; and
an MTJ dielectric layer between the first memory cell and the second memory cell.

12. The integrated circuit of claim 11 further comprising:
a first capacitor interconnect in electrical communication with the first capacitor plate; and
a second capacitor interconnect in electrical communication with the second capacitor plate.

13. An integrated circuit comprising:
a first vertical contact stack comprising a first base contact and a first stacked contact overlying the first base contact, wherein the first stacked contact and the first base contact are in direct electrical contact;
a second vertical contact stack comprising a second base contact and a second stacked contact overlying the second base contact, wherein the second stacked contact and the second base contact are in direct electrical contact;
a base interlayer dielectric positioned between the first base contact and the second base contact;
a stacked interlayer dielectric positioned between the first stacked contact and the second stacked contact;
a first memory cell in direct electrical contact with the first vertical contact stack;
a second memory cell in direct electrical contact with the second vertical contact stack;
an MTJ dielectric layer positioned between the first memory cell and the second memory cell; and
a capacitor, wherein the capacitor comprises a first capacitor plate and a second capacitor plate, wherein the first capacitor plate comprises the first vertical contact stack and the first memory cell, and wherein the second capacitor plate comprises the second vertical contact stack and the second memory cell.

14. The integrated circuit of claim 13 wherein the first memory cell comprises a pinning layer that is magnetic, a tunnel barrier layer overlying the pinning layer, wherein the tunnel barrier layer comprises an electrically insulating material, and a free layer overlying the tunnel barrier layer, wherein the free layer is magnetic.

15. The integrated circuit of claim 14 wherein the tunnel barrier layer primarily comprises magnesium oxide.

16. The integrated circuit of claim 14 wherein the pinning layer and the free layer comprise parallel magnetic poles.

17. The integrated circuit of claim 13 wherein the first base contact comprises a lower column and an upper column, wherein the upper column has a larger cross sectional area than the lower column.

18. The integrated circuit of claim 13 further comprising:
 a first capacitor interconnect in electrical communication with the first memory cell; and
 a second capacitor interconnect in electrical communication with the second memory cell.

19. A method of producing an integrated circuit comprising:
 forming a first base contact and a second base contact within a base interlayer dielectric, wherein the base interlayer dielectric is positioned between the first base contact and the second base contact;
 forming a stacked interlayer dielectric overlying the base interlayer dielectric;
 forming a first stacked contact within the stacked interlayer dielectric, wherein the first stacked contact is in electrical communication with the first base contact, wherein the first stacked contact overlies the first base contact;
 forming a second stacked contact within the stacked interlayer dielectric such that the stacked interlayer dielectric is positioned between the first stacked contact and the second stacked contact, wherein the second stacked contact is in electrical communication with the second base contact, and wherein the second stacked contact overlies the second base contact;
 forming a first memory cell overlying the first stacked contact, wherein the first memory cell is in electrical communication with the first stacked contact;
 forming a first capacitor interconnect in electrical communication with the first memory cell such that a first capacitor plate comprises the first base contact, the first stacked contact, and the first memory cell; and
 forming a second capacitor interconnect in electrical communication with the second stacked contact such that a second capacitor plate comprises the second base contact and the second stacked contact, and wherein a capacitor comprises the first capacitor plate and the second capacitor plate, and wherein the capacitor is utilized as a functional capacitor in the integrated circuit.

* * * * *